(12) United States Patent
Chou et al.

(10) Patent No.: US 9,842,955 B2
(45) Date of Patent: Dec. 12, 2017

(54) PHOTOVOLTAIC SYSTEM AND THE MANUFACTURING METHOD THEREOF

(71) Applicant: FLEXWAVE CO., LTD., Zhubei, Hsinchu County (TW)

(72) Inventors: Chun-Hsien Chou, Taichung (TW); Min-Hung Hsu, Taipei (TW); Chia-Chi Kan, Taoyuan (TW)

(73) Assignee: Flexwave Co., Ltd., Zhubei, Hsinchu County (TW)

( * ) Notice: Subject to any disclaimer, the term of this patent is extended or adjusted under 35 U.S.C. 154(b) by 0 days.

(21) Appl. No.: 14/752,606

(22) Filed: Jun. 26, 2015

(65) Prior Publication Data

US 2016/0329448 A1  Nov. 10, 2016

(30) Foreign Application Priority Data

May 5, 2015 (TW) .............. 104114264 A

(51) Int. Cl.
H01L 31/18 (2006.01)
H01L 31/055 (2014.01)
H01L 31/054 (2014.01)
H01L 31/0232 (2014.01)

(52) U.S. Cl.
CPC ...... *H01L 31/055* (2013.01); *H01L 31/02327* (2013.01); *H01L 31/0547* (2014.12); *H01L 31/18* (2013.01); *Y02E 10/52* (2013.01)

(58) Field of Classification Search
CPC .................................................. H01L 31/055
See application file for complete search history.

(56) References Cited

U.S. PATENT DOCUMENTS

| | | | | |
|---|---|---|---|---|
| 4,785,047 A * | 11/1988 | Jensen | .................. | C08K 13/02 524/262 |
| 2010/0193011 A1* | 8/2010 | Mapel | ..................... | C03C 3/102 136/246 |
| 2011/0226332 A1* | 9/2011 | Ford | ........................ | F24J 2/067 136/259 |

(Continued)

OTHER PUBLICATIONS

Chowdruy et al, Stark Spectroscopy of Size-Selected Helical H-Aggregates of a Cyanine Dye Templated by Duplex DNA. Effect of Exciton Coupling on Electronic Polarizabilities, Journal of Physical Chemistry, 2003, vol. 107 pp. 3351-3362.*

(Continued)

*Primary Examiner* — Bethany L Martin
(74) *Attorney, Agent, or Firm* — Muncy, Geissler, Olds & Lowe, P.C.

(57) ABSTRACT

A photovoltaic system consists of a waveguide body, luminescent dyes and a photovoltaic cell. Luminescent dyes and their aggregated particulates with larger diameter are dispersed in the waveguide body to scatter light and transform the first light of the external light into a second light, wherein the wavelength of the second light is longer than the wavelength of the first light. Compared to conventional techniques, the use of luminescent dyes of the present invention can be aggregated into particulates with larger diameter to enhance the power conversion efficiency of the photovoltaic cell, without providing a scattering layer, in order to reduce the production cost and the element complexity of the photovoltaic system. A manufacturing method for a photovoltaic system is also disclosed.

10 Claims, 6 Drawing Sheets

(56) References Cited

U.S. PATENT DOCUMENTS

2012/0118381 A1\* 5/2012 Debije .................. G02B 6/004
136/259
2013/0105709 A1\* 5/2013 Himmelhaus .......... G01N 21/64
250/459.1

OTHER PUBLICATIONS

Mirriam Webster definition of "Scatter".\*

\* cited by examiner

PHOTOVOLTAIC SYSTEM AND THE MANUFACTURING METHOD THEREOF

BACKGROUND OF THE INVENTION

1. Field of the Invention

The present invention relates to a power system and a manufacturing method thereof, and particularly to a photovoltaic system and a manufacturing method thereof.

2. Description of the Prior Art

A traditional photovoltaic system comprises an optical waveguide element composed of glass to guide sunlight to irradiate on a photovoltaic cell, so as to generate electricity. However, in order to increase power efficiency, it is usually needed to dispose a reflection board or scattering structure on a surface of the optical waveguide element, such that the photovoltaic cell can absorb more sunlight. As a result, the production cost and the complexity of the elements of the photovoltaic system are relatively increased.

To sum up the foregoing descriptions, how to provide a photovoltaic system, which can enhance the power efficiency easily, and a manufacturing method thereof is the most important goal for now.

SUMMARY OF THE INVENTION

The present invention is directed to provide a photovoltaic system and a manufacturing method thereof, which employ a luminescent dye that is aggregated into particulates with larger diameters than the luminescent dye, wherein particulates are dispersed in a waveguide body to scatter light. At the same time, the luminescent dye could red-shift the shorter wavelength light into the longer wavelength light to conform to the ideal working wavelength range of the various type of solar cells (such as Si solar cells, CIGS, DSSC, organic, GaAs) to increase the conversion efficiency. Also, the particulates aggregated by the luminescent dye can enhance the power efficiency of the photovoltaic cell without providing a scattering layer, so that the production cost and the complexity of the elements of the photovoltaic system are reduced.

A photovoltaic system of one embodiment of the present invention comprises a waveguide body, a luminescent dye and a photovoltaic cell. The waveguide body has a light incident surface and a first light emitting surface, wherein an external light is incident into the waveguide body through the light incident surface. The luminescent dye is aggregated into particulates with larger diameters than the luminescent dye, wherein the particulates are dispersed in the waveguide body to scatter light and transform a first light of the external light into a second light, wherein a wavelength of the second light is longer than a wavelength of the first light. The photovoltaic cell is embedded within the first light emitting surface or disposed outside the first light emitting surface to receive light in the waveguide body irradiated to the photovoltaic cell to generate electricity.

A method for manufacturing a photovoltaic system of another embodiment of the present invention comprises steps: disposing a photovoltaic cell into a mold; and filling a waveguide material into the mold and curing the waveguide material to form a waveguide body which has a light incident surface and a first light emitting surface, wherein the photovoltaic cell is embedded within the first light emitting surface or disposed outside the first light emitting surface, and a luminescent dye is aggregated into particulates with larger diameters than the luminescent dye and an average diameter of the particulates is between 1 to 80 microns, wherein the particulates are dispersed in the waveguide body to scatter light and transform a first light of an external light incident to the waveguide body into a second light, wherein a wavelength of the second light is longer than a wavelength of the first light.

The objectives, subject matters and properties of the present invention and the effects achieved by the present invention will become apparent from the following descriptions of the embodiments taken in conjunction with the accompanying drawings.

DESCRIPTION OF THE PREFERRED EMBODIMENT

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts or all of the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
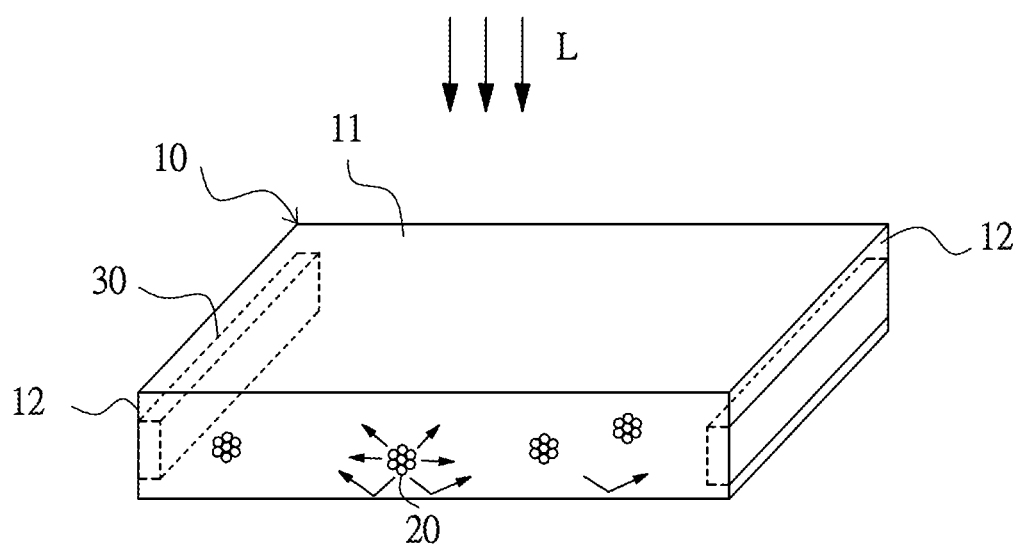
FIG. 1 is a diagram schematically showing a photovoltaic system of one embodiment of the present invention.

Referring to FIG. 1, a photovoltaic system of one embodiment of the present invention comprises a waveguide body 10, a luminescent dye and a photovoltaic cell 30. The waveguide body 10 has a light incident surface 11 and a first light emitting surface 12, wherein an external light L is incident into the waveguide body 10 through the light incident surface 11.

Figure 2A:
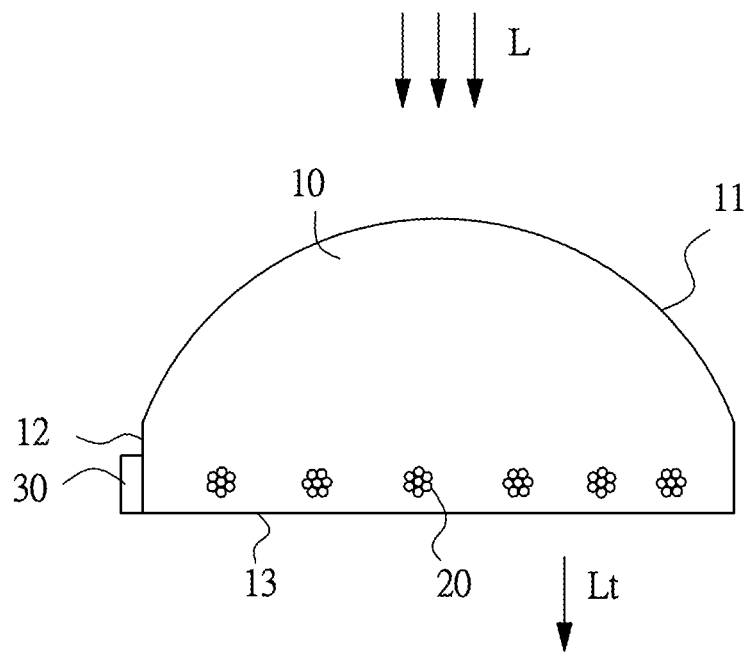
FIG. 2a is a diagram schematically showing a photovoltaic system of another embodiment of the present invention.
Figure 2B:
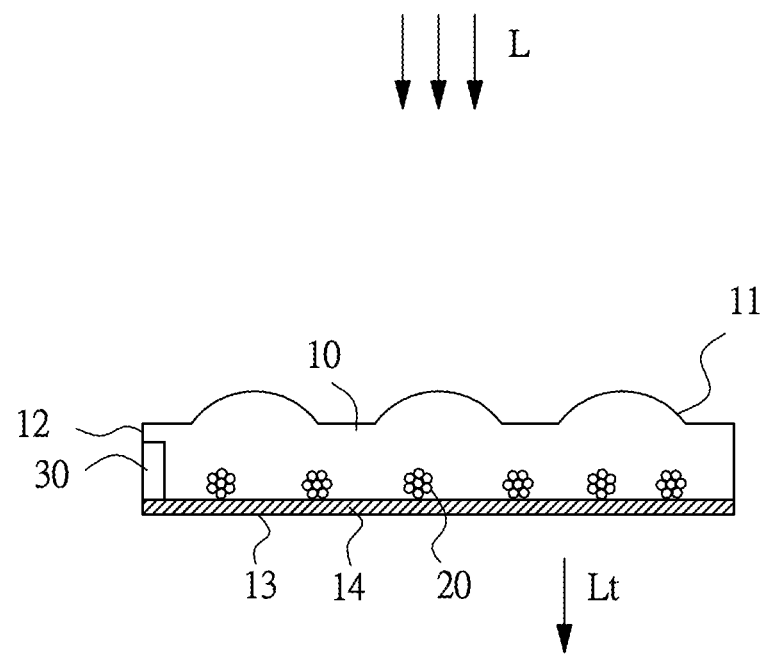
FIG. 2b is a diagram schematically showing a photovoltaic system of yet another embodiment of the present invention.

In this embodiment, the light incident surface 11 is a flexible plane, but is not limited to this. Referring to FIG. 2a and FIG. 2b together, in order to make the waveguide body 10 to be able to gather more external light L, the light incident surface 11 comprises at least one curved surface. In one embodiment of FIG. 2a, the light incident surface 11 is a protrusive half sphere, while in one embodiment of FIG. 2b, the light incident surface 11 comprises a plurality of half spherical, curved surfaces arranged in a matrix to gather sunlight from different irradiation angles. Those skilled in the art may make appropriate modifications and changes, and the shape of the waveguide body 10 is not limited by the present invention.

In order to increase the power efficiency of the photovoltaic cell, the waveguide body further comprises a microstructure, which is disposed at any surface of the waveguide body except for the light incident surface and the first light emitting surface, to increase the amount of the light irradiated to the first light emitting surface. Referring to FIG. 2b, in one embodiment, a microstructure 14 is disposed at a side of a second light emitting surface 13 of the waveguide body 10. For example, the microstructure 14 may be a pyramid microstructure, a half spherical microstructure, a rectangular microstructure, a roughed microstructure or a combination of the above.

Referring to FIG. 2a and FIG. 2b together, the waveguide body 10 further comprises a second light emitting surface 13 opposed to the light incident surface 11, the second light emitting surface 13 provides illumination with light Lt transmitted through the second light emitting surface 13, wherein the first light emitting surface 12 is connected to the light incident surface 11 and the second light emitting surface 13. It can be understood that the first light emitting surface 12 may be a plane or a continuous surface connected by multiple planes, but is not limit to this.

A waveguide material of the waveguide body 10 comprises at least one of a thermoplastic elastomer (TPE) and a photocureable polymer (PCP). The thermoplastic elastomer is a material that is high resilient, environmentally friendly, non-toxic and safe, and whose texture is softer and more elastic than plastic particles. Also, the processing progress of the thermoplastic elastomer needs no vulcanization and it has properties of excellent coloring ability and weather resistance. For example, the thermoplastic elastomer waveguide material comprises thermoplastic rubber (TPR), thermoplastic vulcanizate (TPV), thermoplastic polyurethane (TPP) and thermoplastic polyether ester elastomer (TPEE), while the photocureable polymer comprises polydimethylsiloxane (PDMS) that is also a thermoplastic polyurethane (TPP) material. The commonly used flexible waveguide materials and the category thereof are listed in table 1, but are not limited to this.

TABLE 1

| Name (abbreviation) | category |
| --- | --- |
| Polystyrene (PS) | TPR |
| styrene-ethylene/butylene-styrene (SEBS) | TPR |
| Polydimethylsiloxane (PDMS) | TPR/PCP |
| Polyvinyl Alcohol (PVA) | TPV |
| Polyvinyl Pyrrolidone (PVP) | TPV |
| Cycloolefin copolymer (COC) | TPV |
| Polyurethane (PU) | TPP |
| Polycarbonate (PC) | TPEE |
| poly(ethylene terephthalate) (PET) | TPEE |
| polyethylene terephthalate (PETG) | TPEE |
| Poly methyl methacrylate (PMMA) | TPEE/PCP |
| Styrene methyl metacrylate (SMMA) | TPEE |

The waveguide material of the present invention has flexibility, shaping ability and weather resistance, and is suitable for an integrated process. In addition, the waveguide material of the present invention can encapsulate various electronic elements and provide protection, and is suitable for various installation places. For example, referring to FIG. 1 and FIG. 2b together, the waveguide body 10 encapsulates at least one photovoltaic cell 30, which is embedded within the first light emitting surface 12 to receive light in the waveguide body 10 irradiated to the photovoltaic cell 30, but is not limited to this. In another embodiment, referring to FIG. 2a, the photovoltaic cell 30 is disposed outside the first light emitting surface 12, and may receive light in the waveguide body 10 irradiated to the photovoltaic cell 30 as well, so as to generate electricity.

Figure 3:
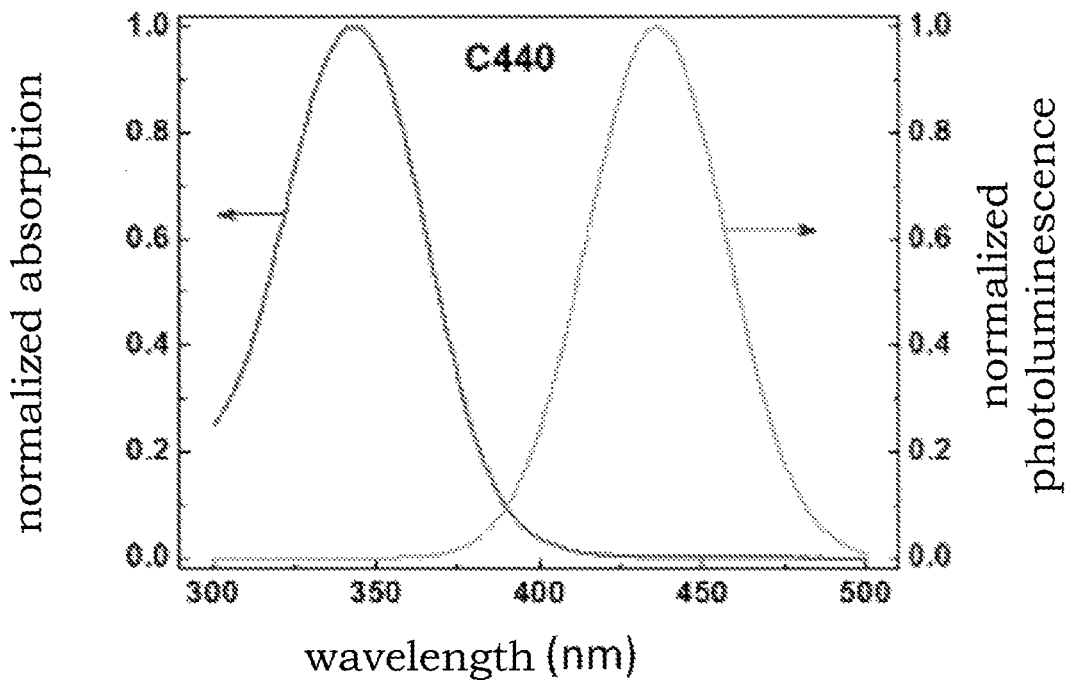
FIG. 3 is a curve diagram showing the luminance spectrum of the luminescent dye of one embodiment of the present invention.
Figure 4:
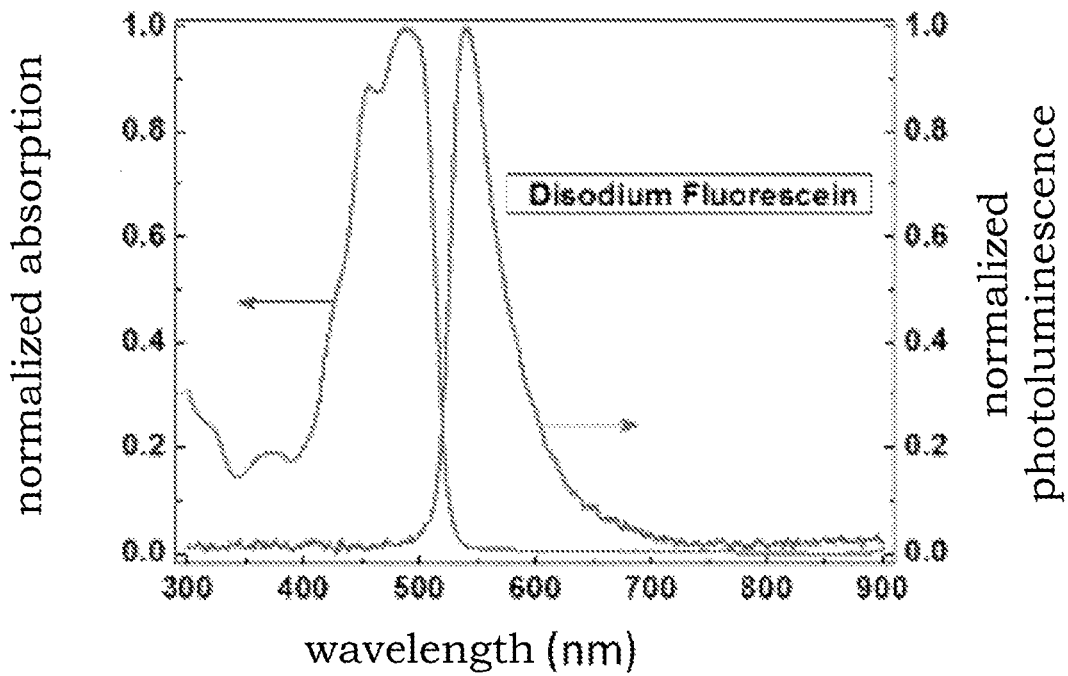
FIG. 4 is a curve diagram showing the luminance spectrum of the luminescent dye of another embodiment of the present invention.

Continued to refer to FIG. 1, the luminescent dye is aggregated into particulates 20 with larger diameters than the luminescent dye, wherein the particulates 20 are dispersed in the waveguide body 10. The luminescent dye has an optical property that makes a wavelength of the incident light to have red-shift phenomenon, which can transform a first light of the external light L into a second light, wherein a wavelength of the second light is longer than a wavelength of the first light. For example, referring to FIG. 3, the luminescent dye of 7-amino-4-methylcoumarin (Coumarin 440) absorbs ultraviolet light having a wavelength range between 300 to 400 nm to generate blue light having a wavelength range between 400 to 500 nm. Referring to FIG. 4, Disodium Fluorescein absorbs ultraviolet light and blue light having a total wavelength range between 300 to 500 nm to generate purple-green light and red light having a total wavelength range between 500 to 700 nm. Traditional manufacturing technology of the optical waveguide element may dope luminescent dye uniformly into the optical waveguide glass to avoid the luminescent dye to be aggregated with each other. However, the luminescent dye of the present invention is dispersed in the above-mentioned flexible waveguide material, and will be aggregated into particulates having micron level or more to scatter light as the concentration of the luminescent dye increases.

Figure 5:
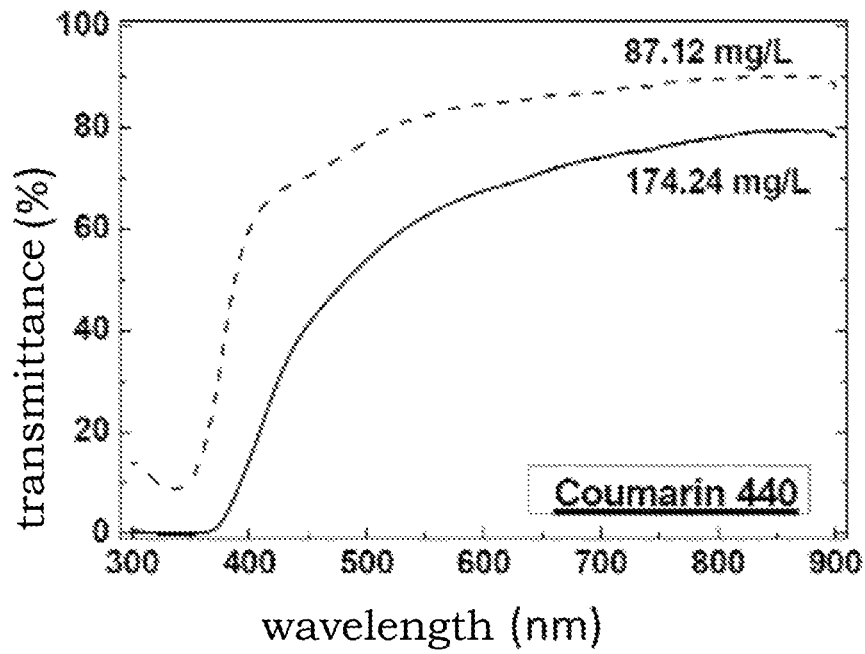
FIG. 5 is a curve diagram showing the transmittance spectrum of the photovoltaic system of one embodiment of the present invention.
Figure 6:
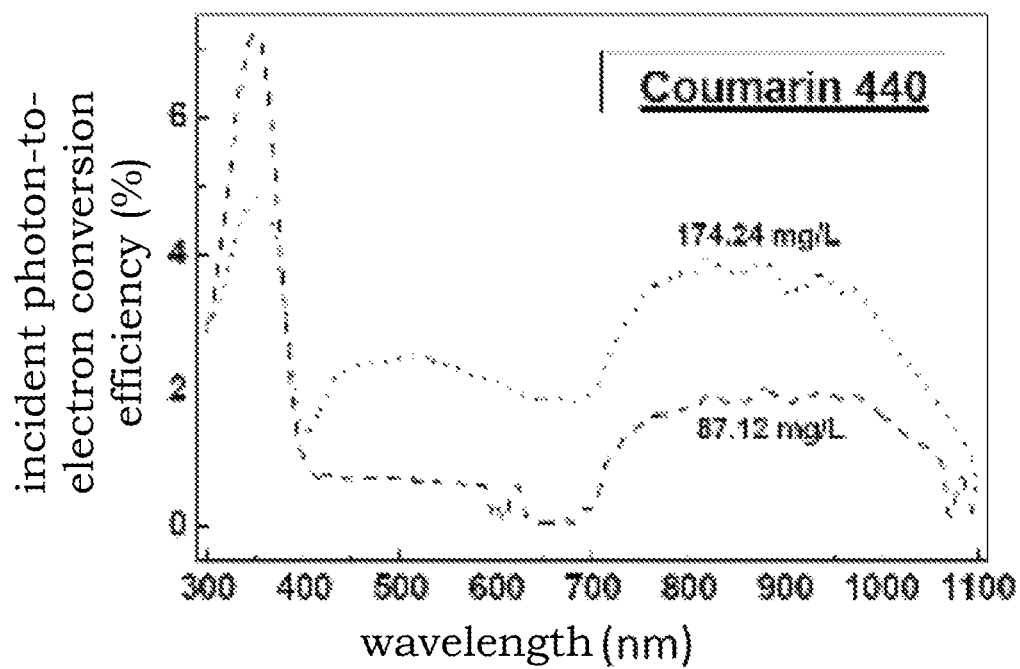
FIG. 6 is a curve diagram showing the incident photon-to-electron conversion efficiency of the photovoltaic system of one embodiment of the present invention.
Figure 7:
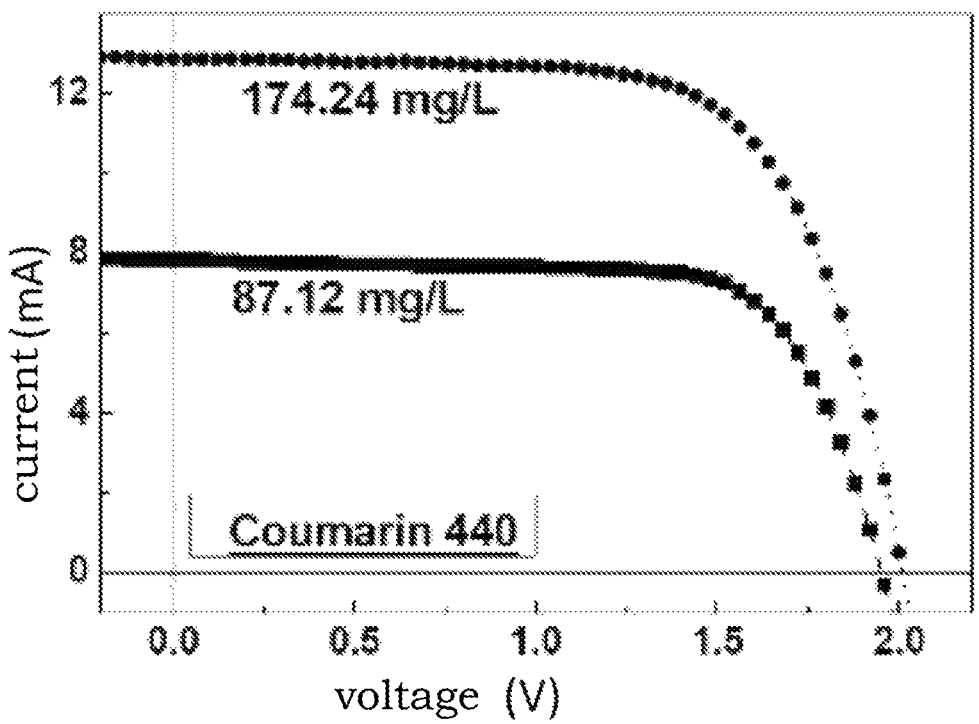
FIG. 7 is a curve diagram showing a relationship between the voltage and the current of the photovoltaic system of one embodiment of the present invention.

In one embodiment shown in FIG. 1, what is described below is that the luminescent dye of different concentrations will change a transmittance of the waveguide body and promote the power efficiency of the photovoltaic cell. Referring to FIG. 5, in a waveguide material composed of polydimethylsiloxane (PDMS), when the doping concentration of the luminescent dye of 7-amino-4-methylcoumarin (Coumarin 440) is increased from 87.12 mg/L to 174.24 mg/L, the transmittance measured outside the second light emitting surface of the waveguide body will decrease accordingly, which means that more portion of the external light is captured by the waveguide body and does not penetrate the waveguide body. Referring to FIG. 6 simultaneously, it can be found that as the doping concentration of the luminescent dye is increased, the incident photon-to-electron conversion efficiency of the photovoltaic cell is enhanced as well, which means that a more portion of the external light is captured by the waveguide body and is used to provide to the photovoltaic cell to generate electricity. It is noted that the increase of the incident photon-to-electron conversion efficiency in the blue light spectrum having a wavelength range between 400 to 500 nm may be related to that the luminescent dyes of 7-amino-4-methylcoumarin (Coumarin 440), which absorb more ultraviolet light having a wavelength range between 300 to 400 nm due to the increased concentration, generate more blue light having a wavelength range between 400 to 500 nm. However, the increase of the incident photon-to-electron conversion efficiency in the green light and red light spectrum can not be explained with the above-mentioned red-shift phenomenon for now. In addition, by further measuring the image of the particulates of the luminescent dye, it can be known that the luminescent dye is aggregated into particulates with diameters between 1 to 100 microns. The particulates having preferred incident photon-to-electron conversion efficiency have an average diameter of 29 microns. Thus, in FIG. 6, the increase of the incident photon-to-electron conversion efficiency in the long wavelength spectrum is resulted from that the particulates aggregated by the luminescent dye scatter more green light and red light in the waveguide body to irradiate the photovoltaic cell. Referring to FIG. 7, a relation diagram showing that the voltage and current of the photovoltaic system vary with the change of the concentration of the luminescent dye is shown. The open-circuit voltage, short-circuit current, fill factor and power conversion efficiency of the photovoltaic cell are shown in table 2 below.

Figure 8:
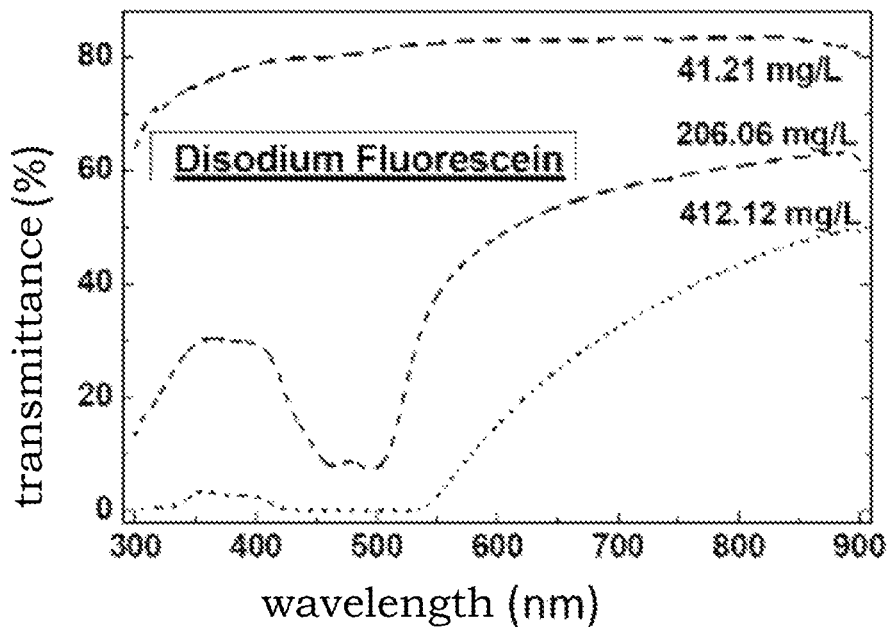
FIG. 8 is a curve diagram showing the transmittance spectrum of the photovoltaic system of another embodiment of the present invention.
Figure 9:
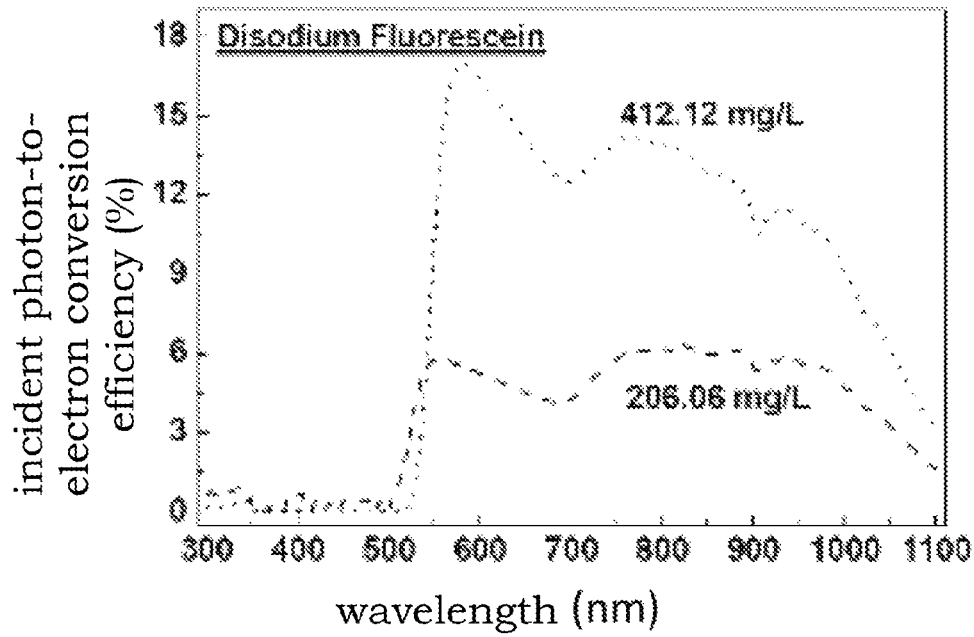
FIG. 9 is a curve diagram showing the incident photon-to-electron conversion efficiency of the photovoltaic system of another embodiment of the present invention.
Figure 10:
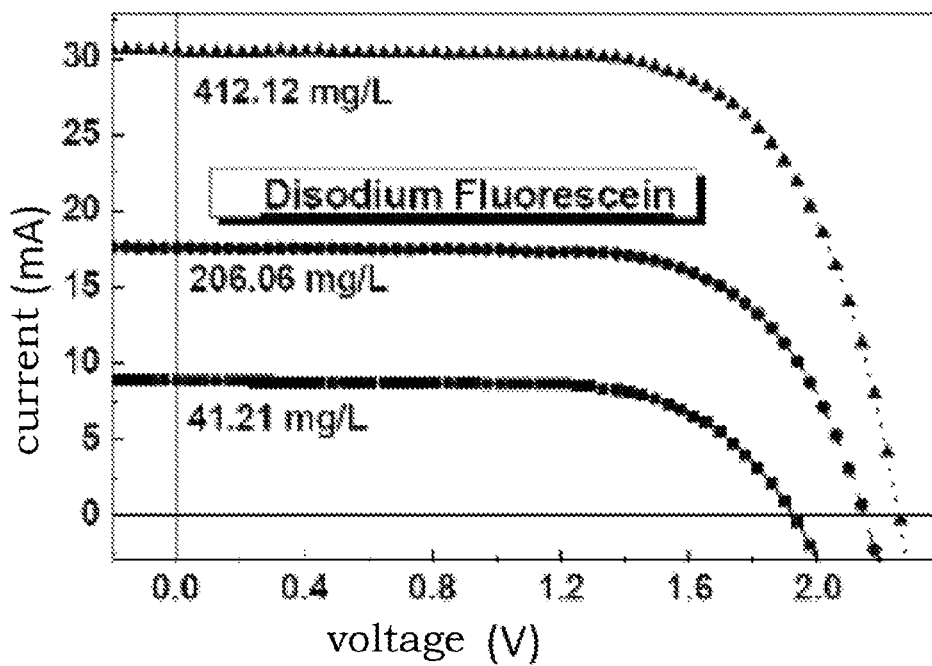
FIG. 10 is a curve diagram showing a relationship between the voltage and the current of the photovoltaic system of another embodiment of the present invention.

Likewise, in a waveguide material composed of polydimethylsiloxane (PDMS), when the doping concentration of the luminescent dye of Disodium Fluorescein is gradually increased from 41.21 mg/L to 412.12 mg/L, the transmittance of the waveguide body measured outside the second light emitting surface of the waveguide body will also decrease accordingly, as shown in FIG. 8. The transmittance measured outside the second light emitting surface of the waveguide body will decrease accordingly, which means that more portion of the external light is captured by the waveguide body and does not penetrate the waveguide body. Referring to FIG. 9 simultaneously, it can be found that as the doping concentration of the luminescent dye is increased, the incident photon-to-electron conversion efficiency of the photovoltaic cell is enhanced as well, which means that more portion of the external light is captured by the waveguide body and is used to provide to the photovoltaic cell to generate electricity. Moreover, by measuring the image of the particulates of the luminescent dye, it can be known that the luminescent dye is aggregated into particulates with diameters between 1 to 100 microns. Referring to FIG. 10, a relation diagram showing that the voltage and current of the photovoltaic system vary with the change of the concentration of the luminescent dye is shown. The open-circuit voltage, short-circuit current, fill factor and power conversion efficiency of the photovoltaic cell are shown in table 2 below.

TABLE 2

| Doped Dye | Doping Concentration (mg/L) | Open-circuit Voltage (V) | Short-circuit Current (mA) | Fill Factor | Power Conversion Efficiency (%) |
| --- | --- | --- | --- | --- | --- |
| 7-amino-4-methylcoumarin | 87.12 | 1.94 | 7.81 | 0.71 | 0.44 |
|  | 174.24 | 2.00 | 12.90 | 0.67 | 0.69 |
| Disodium Fluorescein | 41.21 | 1.93 | 8.87 | 0.67 | 0.46 |
|  | 206.06 | 2.15 | 17.57 | 0.68 | 1.03 |
|  | 412.12 | 2.26 | 30.46 | 0.68 | 1.88 |

Continued with the foregoing descriptions, the luminescent dye aggregated into particulates with larger diameters may scatter any light in the waveguide body which comprises the second light and the untransformed light of other wavelength range of the external light. In one embodiment, as shown in FIG. 2a, the particulates 20 are dispersed close to the second light emitting surface 13 to scatter light, so as to increase the amount of the light irradiated to the photovoltaic cell 30. However, if those skilled in the art want to use the light Lt transmitted through the second light emitting surface 13 to provide illumination, it can be done by adjusting the doping concentration of the luminescent dye to control the average diameter of the particulates to be less than 80 microns, such that a too low transmittance of the waveguide body can be avoided. Thus, the particulates aggregated by the luminescent dye can replace traditional doped scattering particulates or reflection board.

It can be understood that because the waveguide material has transparency, flexibility, shaping ability and weather resistance and the luminescent dye can transform the external light of portion of the wavelength range, the photovoltaic system of the present invention can be applied to the external windows of buildings to provide light that the plant factory or indoor illumination needs. Moreover, the ultraviolet light in sunlight that is harmful for life will be transformed into visible light of long wavelength by the luminescent dye, and therefore, the photovoltaic system of the present invention has the effect of resisting the ultraviolet light.

A method for manufacturing a photovoltaic system of one embodiment of the present invention is described below. The selectable waveguide material comprises at least one of a thermoplastic elastomer (TPE) and a photocureable polymer (PCP). For example, the waveguide material comprises at least one of polystyrene (PS), polycarbonate (PC), polyurethane (PU), cycloolefin copolymer (COC), poly(ethylene terephthalate) (PET), poly methyl methacrylate (PMMA), polyethylene terephthalate (PETG), styrene methyl metacrylate (SMMA), styrene-ethylene/butylene-styrene (SEBS), polyvinyl alcohol (PVA), polyvinyl pyrrolidone (PVP), and polydimethylsiloxane (PDMS). In one embodiment, the waveguide material of polydimethylsiloxane (PDMS) is selected because it has high transmittance, high flexibility and shaping ability to manufacture an illumination system that can guide sunlight. Preparing a waveguide material in advance is as following: a suitable amount of PDMS is drawn and a curing agent is added in accordance with the proportion, e.g. the volume ratio of the PDMS and the curing agent being 10:1; and the resultant is placed undisturbedly for a period of time or placed in a vacuum chamber after stirring uniformly to remove air bubbles, wherein the type of the curing agent is not limited to the photocureable agent or the thermosetting agent.

First, a photovoltaic cell is disposed into a mold. Then, a waveguide material is filled into the mold, and the waveguide material is cured to form a waveguide body which has a light incident surface and a first light emitting surface, wherein the photovoltaic cell is embedded within the first light emitting surface or disposed outside the first light emitting surface, and a luminescent dye is aggregated into particulates with larger diameters than the luminescent dye, wherein the particulates are dispersed in the waveguide body to scatter light and transform a first light of an external light incident to the waveguide body into a second light, wherein a wavelength of the second light is longer than a wavelength of the first light.

In one embodiment, the waveguide body further comprises a second light emitting surface opposed to the light incident surface, and the second light emitting surface provides illumination with light transmitted through the second light emitting surface, wherein the first light emitting surface is connected to the light incident surface and the second light emitting surface. In one embodiment, the particulates 20 are disposed close to the second light emitting surface.

In one embodiment, the luminescent dye comprises at least one of 7-amino-4-methylcoumarin (Coumarin 440) and Disodium Fluorescein. In one embodiment, the step of filling the waveguide material further comprises adjusting a doping concentration of the luminescent dye in the waveguide material to control an average diameter of the particulates. However, the method of controlling the average diameter of the particulates is not limited to this. In another embodiment, the luminescent dye is aggregated into particulates in advance with a chemical deposition method. For example, the waveguide material is filled into the mold, and process parameters are controlled to half cure the waveguide material to form a waveguide body. Then, the particulates aggregated in advance are doped close to the second light emitting surface in the waveguide body to be dispersed in the waveguide body. Then, the waveguide body is cured completely. In one embodiment, an average diameter of the particulates can be controlled between 1 to 80 microns. Preferably, the average diameter of the particulates is between 20 to 30 microns as described above, and the descriptions are omitted here.

In order to increase the power efficiency of the photovoltaic cell, in one embodiment, an inner wall of the mold has a reverse microstructure, such that the waveguide body forms a corresponding microstructure which is disposed at any surface of the waveguide body except for the light incident surface and the first light emitting surface. For example, the microstructure may be a pyramid microstructure, a half spherical microstructure, a rectangular microstructure, a roughed microstructure or a combination of the above. In another embodiment, with the design of the mold, the light incident surface may have at least one curved surface as described above, and the descriptions are omitted here.

To sum up the foregoing descriptions, a photovoltaic system and a manufacturing method thereof of the present invention employ a luminescent dye which is aggregated into particulates with larger diameters than the luminescent dye, wherein the particulates are dispersed in the waveguide body to scatter light and improve power efficiency. Also, the luminescent dye transforms a first light of an external light into a second light, wherein a wavelength of the second light is longer than a wavelength of the first light to conform to the working wavelength range that various photovoltaic cells need. Compared to the traditional technology, the photovoltaic system of the present invention employs the particulates aggregated by the luminescent dye to enhance the power efficiency of the photovoltaic cell without providing a scattering layer, so that the production cost and the complexity of the elements of the photovoltaic system are reduced. Furthermore, the photovoltaic system of the present invention can be applied to the external windows of buildings to provide light that the plant factory or indoor illumination needs, and has the effect of resisting the ultraviolet light.

What is claimed is:

1. A method for manufacturing a photovoltaic system comprising:
    disposing a photovoltaic cell into a mold;
    filling a waveguide material into the mold and curing the waveguide material to form a waveguide body which has a light incident surface and a first light emitting surface, wherein the photovoltaic cell is embedded within the first light emitting surface or disposed outside the first light emitting surface; and
    providing a concentration of luminescent dyes in the waveguide material such that the luminescent dyes aggregate into particulates with an average diameter between 1 and 80 microns,
    wherein the luminescent dyes are dispersed in the waveguide body to transform a first light of an external light into a second light, a wavelength of the second light being longer than a wavelength of the first light,
    wherein the particulates are provided in the waveguide body to increase scattering of the first light not transformed by the waveguide body so as to increase a photon-to-electron conversion efficiency of the photovoltaic system.

2. The method for manufacturing a photovoltaic system according to claim 1, wherein the waveguide body further comprises a second light emitting surface opposed to the light incident surface, and the second light emitting surface provides illumination with light transmitted through the second light emitting surface, wherein the first light emitting surface is connected to the light incident surface and the second light emitting surface.

3. The method for manufacturing a photovoltaic system according to claim 2, wherein the particulates are close to the second light emitting surface.

4. The method for manufacturing a photovoltaic system according to claim 1, wherein adjusting the concentration of the luminescent dyes in the waveguide material controls the average diameter of the particulates.

5. The method for manufacturing a photovoltaic system according to claim 1, wherein the average diameter of the particulates is between 20 and 30 microns.

6. The method for manufacturing a photovoltaic system according to claim 1, wherein the luminescent dyes comprise at least one of 7-amino-4-methylcoumarin (Coumarin 440) and Disodium Fluorescein.

7. The method for manufacturing a photovoltaic system according to claim 1, wherein the waveguide material is flexible and comprises at least one of a thermoplastic elastomer (TPE) and a photocureable polymer (PCP).

8. The method for manufacturing a photovoltaic system according to claim 7, wherein the waveguide material of the waveguide body comprises at least one of polystyrene (PS), polycarbonate (PC), polyurethane (PU), cycloolefin copolymer (COC), poly(ethylene terephthalate) (PET), poly methyl methacrylate (PMMA), polyethylene terephthalate (PETG), styrene methyl metacrylate (SMMA), styrene-ethylene/butylene-styrene (SEBS), polyvinyl alcohol (PVA), polyvinyl pyrrolidone (PVP), and polydimethylsiloxane (PDMS).

9. The method for manufacturing a photovoltaic system according to claim 1, wherein the light incident surface comprises at least one curved surface.

10. The method for manufacturing a photovoltaic system according to claim 1, wherein an inner wall of the mold has a reverse microstructure, such that the waveguide body forms a corresponding microstructure which is disposed at any surface of the waveguide body except for the light incident surface and the first light emitting surface.

\* \* \* \* \*